United States Patent
Barth et al.

(10) Patent No.: US 6,849,563 B2
(45) Date of Patent: Feb. 1, 2005

(54) METHOD AND APPARATUS FOR CONTROLLING COATING THICKNESS

(75) Inventors: Edward Barth, Ridgefield, CT (US); John A. Fitzsimmons, Poughkeepsie, NY (US); Arthur W. Martin, Queens Village, NY (US); Lee M. Nicholson, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 10/314,798

(22) Filed: Dec. 9, 2002

(65) Prior Publication Data

US 2004/0110394 A1 Jun. 10, 2004

(51) Int. Cl.[7] ............................................... H01L 21/31
(52) U.S. Cl. .................... 438/782; 438/780; 427/498
(58) Field of Search ......................... 438/778, 780–784; 427/498, 512, 496, 487, 508

(56) References Cited

U.S. PATENT DOCUMENTS

| 6,033,728 A | 3/2000 | Kikuchi et al. | 427/240 |
| 6,066,574 A | 5/2000 | You et al. | 438/781 |
| 6,255,232 B1 | 7/2001 | Chang et al. | 437/780 |
| 6,376,013 B1 * | 4/2002 | Rangarajan et al. | 427/240 |
| 6,407,009 B1 | 6/2002 | You et al. | 438/782 |
| 6,423,380 B1 | 7/2002 | Courtenay | 427/421 |

FOREIGN PATENT DOCUMENTS

JP                 8177      *  1/1999

* cited by examiner

*Primary Examiner*—Carl Whitehead, Jr.
*Assistant Examiner*—Thanhha Pham
(74) *Attorney, Agent, or Firm*—John Jordan; Margaret A. Pepper

(57) ABSTRACT

The coating thickness and uniformity of spin-on deposition layers on semiconductor wafers is controlled through the in situ control of the viscosity and homogeneity of the mixture of precursor material and solvent material. The thickness of the deposited material is selected and the viscosity required at a given spin rate for the selected thickness is automatically mixed. Sensing and control apparatus are employed to ensure that the uniformity and viscosity required is maintained before dispensing onto said semiconductor wafer. Low-K dielectric materials of selected thickness are deposited in a uniform coating.

9 Claims, 1 Drawing Sheet

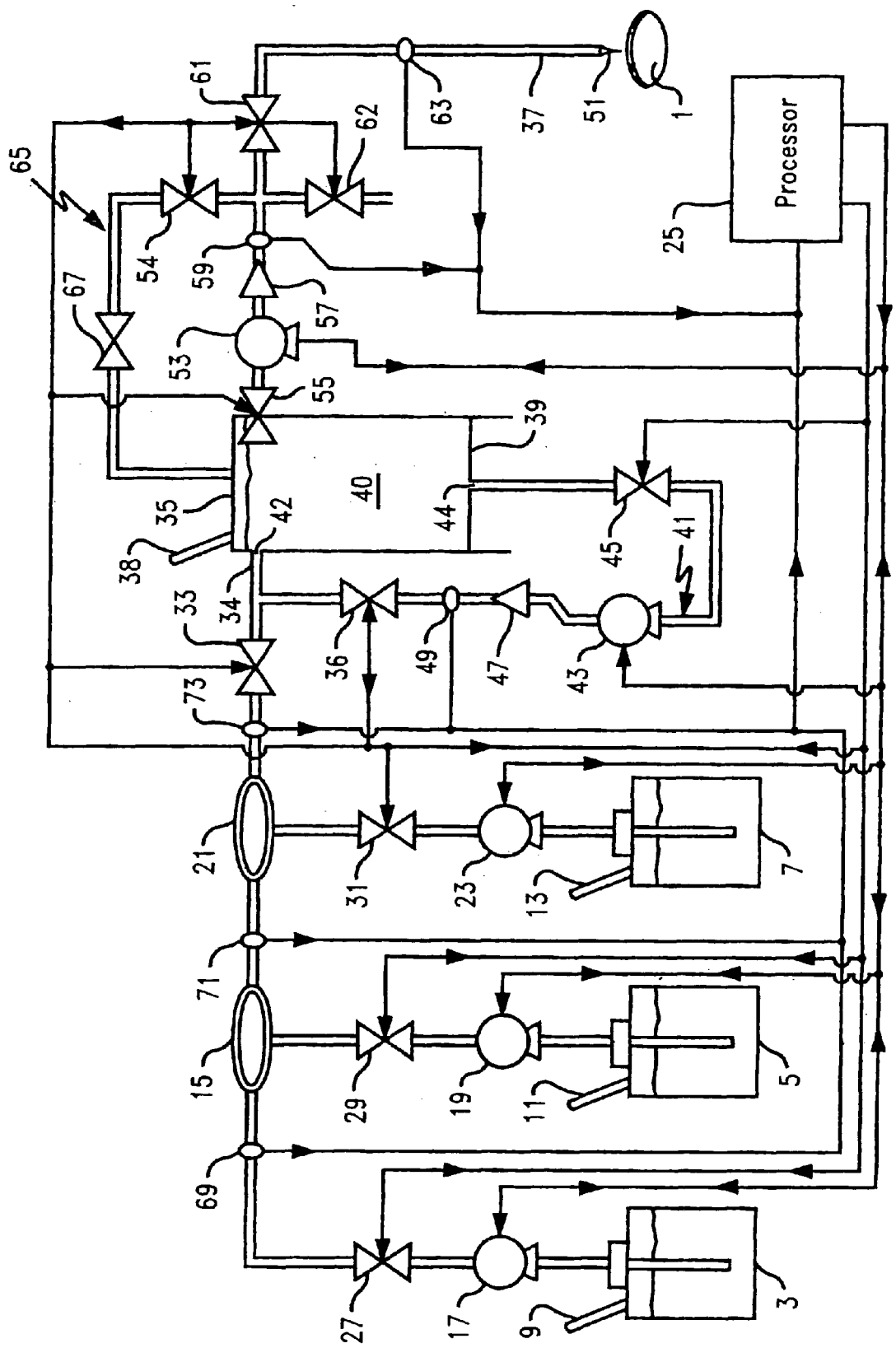

METHOD AND APPARATUS FOR CONTROLLING COATING THICKNESS

BACKGROUND OF THE INVENTION

1. Field of the Invention

The present invention relates to a method and apparatus for controlling the coating thickness of materials applied to the surface of semiconductor wafers. More particularly, the present invention relates to a method and apparatus for controlling the thickness and uniformity of thin films deposited upon the surface of semiconductor wafers by spin coating deposition.

2. Background and Related Art

Spin-on deposition methods, as known in the semiconductor manufacturing art, are used to form thin films on semiconductor devices, such as, semiconductor wafers. Typically, a solution comprising at least one solvent and a precursor of the material to be deposited is placed in the center of a semiconductor wafer and then the wafer is rotated at a rate sufficient to distribute the solution across the surface of the wafer. The amount of solution, the solution viscosity, the solvent evaporation rate and rotational speed determine, in general, the thickness of the spin-on coating.

The spin-on deposition method of depositing thin films is used in the formation of a variety of materials. For example, spin-on deposition may be used to form photoresist layers and various insulating layers, such as, low-K dielectric polymer layers. In a conventional spin coating process, the semiconductor wafer to be processed is placed on a rotable chuck and held in place by a vacuum. However, as wafers have become increasingly larger, it has been found that the chucks' ability to hold the wafer in place at higher rotational speeds is diminished. This limitation on rotational speed has created difficulties in controlling the thickness of the deposited layer.

For example, in the deposition of low-K dielectric polymer materials, this speed limitation necessitates the manufacture of several grades of the precursor material to satisfy the various thickness requirements for the different wiring levels for device manufacture, such as, those employed in CMOS technologies. Each of the different grades has a different viscosity that limits thickness range. To obtain a required thickness within this range, the material is modified by adjusting the precursor/solvent ratio and then formulating new rotational spin speeds recipes to cover the thickness range. The difficulty with the above approach, however, is it is complex, costly and does not always give the results desired. For example, faster spin speeds are required to achieve the lower end of the thickness range and these faster speeds may result in planarity-related defects. It is also costly from a materials and process standpoint to have several grades of material for one or more interconnect technologies. In addition, dilution of the precursor material has to be performed manually, often necessitating several iterations to achieve acceptable wetting characteristics. This is time consuming and costly.

SUMMARY OF THE PRESENT INVENTION

Accordingly, it is an object of the present invention to provide an improved spin-on deposition method and apparatus.

It is a further object of the present invention to provide a method and apparatus for controlling the thickness and uniformity of spin-on coatings.

It is yet a further object of the present invention to provide in-situ method and apparatus for accurately mixing a precursor material with solvents to thereby control the thickness and uniformity of films formed on semiconductor wafers by spin-on deposition.

It is another object of the present invention to provide a method and apparatus for controlling, in real time, the viscosity of precursor materials employed to form films on semiconductor wafers by spin-on deposition.

It is yet another object of the present invention to provide an in-situ method and apparatus for controlling the quality of dielectric polymer coatings formed by spin-on deposition.

It is still yet another object of the present invention to provide an in-situ method and apparatus for selectively controlling and monitoring the viscosity and homogeneity of a precursor material mixed with a solvent or solvents to thereby control the thickness and uniformity of subsequent films formed by the application of the resultant solvent-mixed precursor solution onto a substrate.

It is a further object of the present invention to reduce both the number of different polymer solutions required for a given manufacturing process and the amount of waste encountered in trial and error solution mixing and apparatus cleaning.

In accordance with the present invention, a method and apparatus is provided to accurately control, in-situ, the viscosity of a precursor material modified by solvents, as employed in the formation of films on a uniform surface, such as, the surface of a semiconductor wafer, created by spin-on deposition. Selected thicknesses are formed by specifying the ratio of solvents to precursor material for such thicknesses at given rotational speeds. Control apparatus are employed to automatically mix the required volumes of precursor material and solvent materials. Further control apparatus are employed to monitor the mixture to continuously maintain the required ratios as a homogenous liquid mass prior to deposition upon the wafer.

Precursor materials, such as, low-K dielectric polymer materials, of a single viscosity may be employed to selectively form layers of desired various thicknesses at limited rotational spin speeds of the semiconductor wafer. By continuously monitoring and maintaining the required ratio of the low-K dielectric polymer precursor material to solvents in the mixture (and thus viscosity) for a selected thickness and continuously monitoring and maintaining the quality of the mixture, high quality layers or films of uniform thickness are achieved. As used herein the term "quality" as pertains to mixture is intended to mean a measure of material mixture properties including viscosity, homogeneity and purity, as determined by the indications produced by the particular measurement system employed, such as, an optical density measurement system. Thus, the term "optical density" may also be used as a measure of quality.

These foregoing and other objects, features and advantages of the invention will be apparent from the following more particular description of a preferred embodiment of the invention, as illustrated in the accompanying drawings, wherein like reference members represent like parts of the invention.

BRIEF DESCRIPTION OF THE DRAWING

The FIGURE shows a schematic of apparatus employed to carry out the present invention.

DETAILED DESCRIPTION

With reference to the FIGURE, there is shown an in situ arrangement, in accordance with the present invention, for mixing solvents with a precursor material so as to control the thickness and uniformity of films formed by spin-on deposition onto surfaces, such as, semiconductor wafer surfaces. The arrangement may be employed to mix and spin-on, in real time, any of a variety of materials, such as, resists, polyimides and various dielectric materials. The arrangement, however, can also be used to mix a particular recipe to formulate a batch of material for spin-on application at a later time.

In a preferred embodiment of the invention, the arrangement in the FIGURE is employed to mix and deposit a low-K dielectric polymer material on semiconductor wafer 1. In general, such materials may include, but are not limited to, organic polymeric thermoset materials made essentially of carbon, oxygen and hydrogen or poly siloxane type materials, such as, polymethylsiloxanes (MSQs) and polyhydrosiloxanes (HSQs) which are polymeric materials composed essentially of carbon, oxygen, silicon and hydrogen. Other suitable dielectric materials, in general, include spin-on glasses including spin-on glasses composed of silicon oxycarbide, hydrogenated silicon oxycarbide (SiCOH), fluorine doped silicon oxide, and silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-K dielectric.

As shown in the FIGURE, a series of reservoirs 3, 5 and 7 are employed to contain the materials used in the process. Reservoir 3 is employed to contain the low-K dielectric polymer precursor material. Such dielectric materials include the low-K polyarylene ether polymeric material commercially known as SiLK™, available from the Dow Chemical Company, and the low-K polymeric material known as FLARE™, available from Honeywell, Inc.

Other low-K dielectric layers may also be formed by spin-on deposition using alternative commercially available materials. Examples of these include MesoELK™ available from Air Products, Inc., XLK™, a porous version of FOx™ available from Dow Corning, ULK™ available from Japan Synthetic Rubber, and porous SiLK, a porous version of SiLK™ available from the Dow Chemical Company. Examples of commercially available spin-on low-K films with SiCOH-type composition using silsesquioxane chemistry include HOSP™ available from Honeywell, JSR 5109 and 5108 available from Japan Synthetic Rubber, Zirkon™ available from Shipley Microelectronics and a hydrogen silsesquioxane (HSQ) material, FOx™, available from Dow Corning Materials.

Typical commercially available photoresist materials that may be deposited, in accordance with the method and apparatus of the present invention as represented in the FIGURE, include materials such as UV82, NFC1400 and PAR715 available from Japan Synthetic Rubber, and TOK3250 available from Nippon Chemical Company. Other known resists could also similarly be deposited.

With reference to the FIGURE, using, as an example, a precursor of SiLK 1–130 grade used for the 1 micron range, reservoirs 5 and 7 are arranged to contain the solvents cyclohexanone (CHO) and gamma-Butyrolactone (GBL), respectively. In this regard, the particular precursor chosen is one that exhibits one of the highest viscosities of the low-K dielectric materials and it is, therefore, particularly advantageous to have the solvents ordered so that solvent with the highest solvation capability acts to dissolve the solute (precursor material) first. Thus, where the above precursor of SILK 1–130 is used, CHO is introduced before GBL. In like manner, for other material systems, it is most desirable to order the introduction of multiple solvents, such that the higher solvating solvent is introduced first and then the next higher, and so on. The mixing materials may be introduced into the reservoirs in bulk through the respective ports 9, 11 and 13. These ports could also be used to provide pressure or head space. If the ports were to be used for pressure, a collapsible bag arrangement could be employed so as to separate the pressure medium, such as an inert gas, from the liquid materials in the reservoirs.

The precursor SILK material in reservoir 3 is pumped to mixing unit 15 by pump 17 where it is first mixed with CHO solvent pumped from reservoir 5 by pump 19. Similarly, the mixture from mixing unit 15 is fed to mixing unit 21 where it, in turn, is mixed with the GBL solvent in reservoir 7 pumped thereto by pump 23. Fluid pumps 17, 19 and 23, as well as the other pumps employed in the system, may be conventional pump arrangements employing a stepper motor, for example, to control fluid flow. In this regard, the pumps, such as shown by pumps 17, 19 and 23 and those employed throughout the system, are controlled by processor 25. Processor 25 may be, for example, any of a variety of conventional digital processors, as is known to those skilled in the art. Processor 25 acts to control the pump stepper motor speed and therefore volume of material pumped. The volume of material pumped may thus be set to be proportional to the extent of any additional mixing or buffering required.

The volume of fluid flow to mixing units 15 and 21 may also be further controlled by variable control fluid valves 27, 29 and 31. The volume of fluid flow through such valves is controlled by the extend to which they are opened under control of processor 25. On/off control valves may also be employed in arrangements where the volume of fluid flow is left solely to pump control. It should also be noted that processor 25 not only controls pumps 17, 19 and 23 and control valves 27, 29 and 31, but it also receives feedback from each of these devices indicating their actual conditions, as well as feedback from the quality sensors 49, 59, 63, 69, 71 and 73, thereby signaling to the processor whether further adjustments need to be made. Thus, both feed forward and feedback is provided on signal lines between processor 25 and the various control devices, i.e., pumps 17, 19, 23, 43 and 53 and control valves 27, 29, 31, 33, 36, 45, 54, 55 and 62, as indicated by the arrows on these lines going in both directions.

Mixing units 15 and 21 may comprise conventional arrangements of a turbulent flow mixing chamber, such as a Venturi chamber. The chamber arrangement should be such as to provide sufficient residence time and chamber length to allow for adequate mixing, as is understood by those skilled in the art.

The output flow of mixed materials from mixing unit 21 is fed forward through control valve 33 where it is further fed, via input line 34, through an input port 42 into pre-dispense chamber 35 for storing before dispensing onto wafer 1 through output control valve 55 to output dispense line 37. Pre-dispense chamber 35 has a movable mixing chamber base 39 which allows the amount of mixture 40 stored in the chamber to be customized to a particular application or job size (e.g. number of wafers). The movable mixing chamber base 39 may be in the form of a piston at the base of the chamber having movement controlled (not shown) by processor 25 to thereby allow the chamber volume to be adjusted for mixing purposes. Thus, wherever, for example, it is found necessary to further dilute mixed material in the pre-dispense chamber, the chamber may be expanded by moving the mixing chamber base downwardly. On the other hand, where it is necessary to clean the chamber by rinsing, for example, the mixing chamber base may be moved upwardly to reduce the chamber size to minimize the volume to be rinsed and, therefore, reduce both the cleaning time as well as the amount of rinse solvent required for the cleaning operation.

As further shown in the FIGURE, a mixing uniformity loop 41 acts to feed stored mixture 40 in chamber 35 back to input line 34 via an output port 44 on movable mixing chamber base 39. Pump 43 pumps the mixture through control valve 45, cleaning filter 47, sensor 49 and control valve 36 to input line 34. Mixing uniformity loop 41 acts to monitor and controllably cycle back mixture 40 to ensure the quality and, particularly, homogeneity of the mixture.

Again, as shown in the FIGURE, control valves 36 and 45 and pump 43 are under control of processor 25 and these devices also feed back signals indicative of their state. Both control valves 36 and 45 are completely closed when the mixing uniformity loop is not operational, such as, when control valve 33 acts to feed mixed material into chamber 35. Under these conditions, control valve 36 acts to prevent mixed material from entering loop 41 and control valve 45 act to prevent material in the loop from affecting the material in the chamber. It is obviously advantageous to minimize the volume of mixed material between the valves 45 and 36 and, similarly, those volumes of mixed material in the control path when control valve 33 acts to feed mixed material into chamber 35; thus, although single action type control valves are utilized to facilitate the description of operation, it is clear that complex multiple action control valves could be employed and such would tend to minimize the volume of mixed material in the control paths, such as, the volume of mixed material in loop 41.

The various sensors shown in the FIGURE act to indicate a measure of the quality of the material processed at each stage. In particular, it is important that the viscosity of the material at the various stages of the preparation process be monitored and maintained in accordance with the viscosity requirements for the particular thickness to be spin-on deposited. In addition, the homogeneity and purity of the material must also be maintained. Sensors which provide an indication of measure of viscosity, homogeneity and purity may take a variety of forms. However, non-intrussive sensors are preferred since such sensors would have minimal, if any, impact on the flow of material and would avoid the potential for mechanical components contributing particulate contamination to the material.

Thus, non-intrusive sensors, such as, optical density type sensors, would tend to provide a better system of measurements. In this regard, a conventional optical density sensor using broad band infrared spectroscopy may readily be used to measure the degree of darkness and uniformity of the mixtures, thereby providing a measure of the concentration and, therefore, viscosity and homogeneity of the solutions. Such systems are preferred. As is understood by those skilled in the art, the spectral lines of such systems also provide an indication of homogeneity, viscosity and purity of the mixture. In this regard, contaminants would be identified by their spectral lines. Similarly, an optical density type system, such as, a spectroscopic ellypsometer sensing system could also be employed to measure the refractive index of the solution mixtures to thereby provide an indication of viscosity, homogeneity and purity. Optical sensors using inert radiation are preferable. With reference to the FIGURE, then, all of sensors 49, 59, 63, 69, 71 and 73 may be of the broad band optical density type. As further shown in the FIGURE, all of the optical density sensors feed back optical density digital signals of the results they measure to processor 25 for analysis, monitoring and control. The optical density digital signals would typically include a representation of the degree of darkness of the mixture and its spectral indices.

The mixture 40 stored in pre-dispense container 35 is applied to wafer 1 through nozzle 51. In this regard, pump 53 acts to feed the mixture in chamber 35 through control valve 55, cleaning filter 57, sensor 59, control valve 61 and sensor 63 to nozzle 51. The quality of the mixture pumped to nozzle 51 is further ensured by final return loop 65, including control valve 54 and no-return or check valve 67. In this regard, sensors 59 and 63 act to finally measure the quality and, in particular, the optical density indications, to thereby determine the viscosity, homogeneity and purity of the mixture passing to nozzle 51. Where the mixture exhibits the required quality, valve 54 is completely closed. Where the output from either sensor shows unacceptable quality, control valve 54 is open to further mix mixture 40 prior to dispensing.

In this regard, sensor 59 senses the condition of quality of the mixture before it gets to dispense line 37 and sends a signal indicating the condition to processor 25. Where the quality does not meet predetermined conditions, processor 25 opens control valve 54 and closes control valve 61 to initiate further return loop mixing. Check valve 67 does not require processor control but merely acts to prevent forward flow of the mixture from the chamber. Where processor 25 determines the quality of the mixture is satisfactory, as seen by sensor 59, control valve 61 is opened and control valve 54 is completely closed. The extent and duration to which control valve 61 is opened for dispensing is determined by the parameters of the particular application and its recipe, i.e., parameters such as size of wafer, thickness of spin-on layer, spin speed of wafer, viscosity and the like.

Sensor 63 acts as a final check on the quality of the mixture should sensor 59 fail-to indicate unacceptable quality. This is particularly important where the system is used for spin-on deposition of very costly materials and processes, or when process recovery through rework is difficult or impossible. It should be noted that control valve 62 is normally closed and is opened for such operations as cleaning and draining. Control valve 55 at the chamber output port, on the other hand, is open during dispense operations, or such operations as cleaning or when final return loop 65 is activated. Under other conditions, such as, system standby or operation of mixing uniformity loop 41, control valve 55 is closed.

Again, it is obviously advantageous to minimize any volume between the valves 54, 62, and 61 and, thus, although single action type control valves are utilized in this description, the value of complex multiple control valves is understood to minimize the undesired volume contained between these valves.

Recipes may be stored in processor 25 for the various thicknesses required for various technologies. The recipes define acceptable system parameters (also called solution quality parameters) for the various thicknesses at predetermined rotational speeds for a particular material to be spin-on deposited onto the wafer. Deviations from acceptable quality parameters are detected by processor 25 in response to sensor measurements, and processor 25 then acts to cause control signals to be sent to the appropriate pumps and valves to either increase or decrease pumping flow rate and volume to correct for the deviation and obtain solution quality. It is clear that the recipes can be determined experimentally using the mixing system disclosed in accordance with the present invention.

Thus, where, for example, mixing uniformity loop 41 is activated to sample the viscosity of mixture 40 in chamber 35, optical density sensor 49 acts to measure the viscosity of the fluid, either in terms of viscosity uniformity (or magnitude where there is uniformity). This is done by closing control valve 33, opening control valve 36 and starting pump 43. Where there is a deviation from the conditions of the recipe selected as to homogeneity, for example, processor 25 acts to control pump 43 to mix mixture 40 through mixing uniformity loop 41 until optical density sensor 49 indicates the solution quality is correct. Optical density sensors 69, 71, and 73 similarly sense solution quality which is fed back to processor 25 for analysis and comparison to the selected recipe requirements so that corrective action signals may be sent to the appropriate pumps and control valves.

In a typical operation, a recipe corresponding to the spin-on deposition application is selected in processor 25. Signals are sent by processor 25 to respective pumps 17, 19 and 23 and respective control valves 27, 29 and 31 with the signals acting to provide the appropriate pump speeds, valve openings, and the synchronous timing of the two or more components being controlled. The precursor material in reservoir 3 is fed to mixing unit 15 where it is mixed with solvent from reservoir 5. The mixture from mixing unit 15 is then fed to mixing unit 21 for further mixing with the solvent from reservoir 7 and this mixture is, in turn, fed through open control valve 33 to chamber 35. Optical sensors 69, 71 and 73 act to measure the quality of the material flowing forward. Measured optical density signals are sent back to processor 25 for any possible corrections required to make the mixed material conform to the recipe standards stored in the processor. Mixing uniformity loop 41 is periodically activated to sample the mixture 40 in chamber 35 via sensor 49. Where further mixing of mixture 40 is required, control signals sent to pump 43 and valve 36 act to control the degree of correction required. Where all optical sensors, including sensors 59 and 63, indicate the solution with the required quality is being processed, the system is ready to dispense via nozzle 51 onto wafer 1.

It should be noted that it is advantageous to have mixture input line 34, output dispense line 37 through control valve 35, along with final return loop 65, all physically coplanar. A significant attribute of this coplanar arrangement is the minimization of the chamber volume when the chamber base is raised to its highest travel point. In either a real time mixing mode of operation or during a system cleansing operation, minimization of the pre-dispense chamber 35 volume aids in the consistency of such operations. It is clear, that where required, each reservoir could also have its own apparatus to maintain homogeneity and uniformity of the fluid therein. In addition, the output lines of each reservoir could also have sensors to sense the uniformity and quality of the material being pumped therefrom.

Although the FIGURE shows reservoirs for 2 solvents, it is clear that one, two or more reservoirs for solvent may be used. Similarly, although one pre-dispense container is shown, it is clear that more than one may be employed. For example, two pre-dispense containers may be employed where one is operational while the other is being cleaned. Alternatively, several pre-dispense containers may be employed each employed for a different technology.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of forming a layer of material of selected thickness on a surface using a precursor material of known viscosity, comprising the steps of:
   providing a source of said precursor material;
   providing a source ofat least one solvent for mixing with said precursor material;
   forming a mixture by mixing a predetermined amount of said at least one solvent with a predetermined amount of said precursor material of known viscosity to thereby change the viscosity of said precursor material to a predetermined value corresponding to that required to firm said selected thickness at a predetermined rotating frequency of said surface;
   monitoring and measuring the viscosity of said mixture by using sensors;
   providing a nozzle for dispensing said mixture;
   rotating said surface at said predetermined rotating frequency;
   supplying said mixture to said nozzle; and
   dispensing a predetermined volume of said mixture to said rotating surface to thereby form by spin-on deposition said layer of material of selected thickness.

2. The method as set forth in claim 1 including the further step of measuring the quality of said mixture before the step of supplying said mixture to said nozzle.

3. The method as set forth in claim 1 wherein said layer of material of selected thickness is a layer of dielectric material, said surface is a semiconductor surface, and said precursor material is a dielectric precursor material.

4. The method as set forth in claim 3 including the further step of measuring the quality of said mixture and comparing the measured quality with the predetermined quality required to form said selected thickness at said predetermined rotating frequency to thereby determine any deviation therefrom.

5. The method as set forth in claim 4 including the further step of varying the ratio of the said selected amount of said at least one solvent with the said selected amount of said dielectric precursor material in accordance with any such deviation.

6. The method as set forth in claim 5 wherein said dielectric precursor material is a low-K polyarylene ether polymeric material and said at least one solvent includes cyclohexanone and gamma-Butyrolactone wherein said cyclohexanone is first mixed with said low-K polyarylene ether polymeric material.

7. The method as set forth in claim 6 wherein said semiconductor surface comprises a semiconductor wafer.

8. The method as set forth in claim 4 wherein said step of measuring the quality of said mixture comprises measuring using spectroscopy.

9. A method of forming a layer of dielectric material of selected thickness on a semiconductor surface using a low-K polyarylene ether polymeric precursor material of known viscosity, comprising the steps of:
   providing a source of said low-K polyazylene ether polymeric precursor material;
   providing a source of at least one solvent for mixing with said low-K polyazylene ether polymeric precursor material wherein said at least one solvent includes cyclohexanone and gamma-Butyrolactone wherein said cyclohexanone is first mixed with said low-K polyazylene ether polymeric material;

forming a mixture by mixing a selected amount of said at least one solvent with a selected amount of said low-K polyazylene ether polymeric precursor material to thereby change the viscosity of said low-K polyazylene ether polymeric precursor material to a value corresponding to that required to form said selected thickness at a predetermined rotating frequency of said semiconductor surface;

providing a nozzle for dispensing said mixture;

rotating said semiconductor surface at said predetermined rotating frequency;

supplying said mixture to said nozzle; and dispensing a predetermined volume of said mixture to said rotating semiconductor surface to thereby form by spin-on deposition said layer of dielectric material of selected thickness.

* * * * *